(12) United States Patent
Sasaki et al.

(10) Patent No.: US 8,000,359 B2
(45) Date of Patent: Aug. 16, 2011

(54) LASER DEVICE AND CONTROLLING METHOD THEREFOR

(75) Inventors: Hiroyasu Sasaki, Yokohama (JP); Hideo Arimoto, Kodaira (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 12/332,384

(22) Filed: Dec. 11, 2008

(65) Prior Publication Data

US 2009/0262762 A1    Oct. 22, 2009

(30) Foreign Application Priority Data

Dec. 11, 2007   (JP) ................. 2007-320124

(51) Int. Cl.
 *H01S 5/14*   (2006.01)
 *H01S 5/0687*   (2006.01)
(52) U.S. Cl. ..... 372/32; 372/28; 372/29.016; 372/38.01
(58) Field of Classification Search ............. 372/29.016, 372/28, 38.01, 32
 See application file for complete search history.

(56) References Cited

U.S. PATENT DOCUMENTS

| 6,166,837 A | 12/2000 | Adams et al. | |
| 6,661,815 B1 * | 12/2003 | Kozlovsky et al. | ............. 372/20 |

FOREIGN PATENT DOCUMENTS

| JP | 03-129890 | 6/1991 |
| JP | 08-018167 | 1/1996 |
| JP | 2007-234916 | 9/2007 |
| WO | WO 2007/007848 | 1/2007 |
| WO | WO 2008/117572 | 10/2008 |

OTHER PUBLICATIONS

Koji Kudo et al., "Recent Progress on The Wide-Band Wavelength Tunable Lasers and Modules", IEICE Technical Report OPE, Aug. 25-30, 2005.
Search Report issued in European Patent Application No. 08021393.7 on Jul. 29, 2010.

* cited by examiner

*Primary Examiner* — Jessica T Stultz
*Assistant Examiner* — Michael Carter
(74) *Attorney, Agent, or Firm* — Antonelli, Terry Stout & Kraus, LLP.

(57) ABSTRACT

A laser device capable of preventing deterioration of a light signal and a controlling method therefor are provided. A wavelength tunable laser module provided with a resonator including the wavelength tunable filter and a semiconductor light amplifier having a phase adjustment region and a light amplifying region, in which a wavelength margin between a peak transmission wavelength of a wavelength tunable filter and a mode hop occurring wavelength on a short wave side is smaller than that on a long wave side includes: a wavelength tunable laser module controller including an optical output sampling portion for detecting light intensity of light emitted from the resonator, a dither signal source for generating a dither signal for varying a phase adjustment signal to be applied to the phase adjustment region so that the detected light intensity becomes the maximum, and an FM signal source for generating an FM signal for oscillating the phase adjustment signal to be applied to the phase adjustment region with a period shorter than a variation period of the dither signal. The optical output sampling portion detects the light intensity in synchronization with oscillation of the phase adjustment signal by the FM signal.

6 Claims, 7 Drawing Sheets

FIG. 1
(a) RESONANCE WAVELENGTH
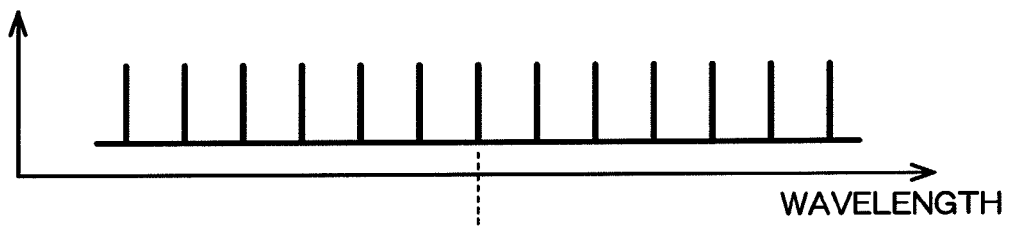
(b) WAVELENGTH TUNABLE
    FILTER CHARACTERISTICS
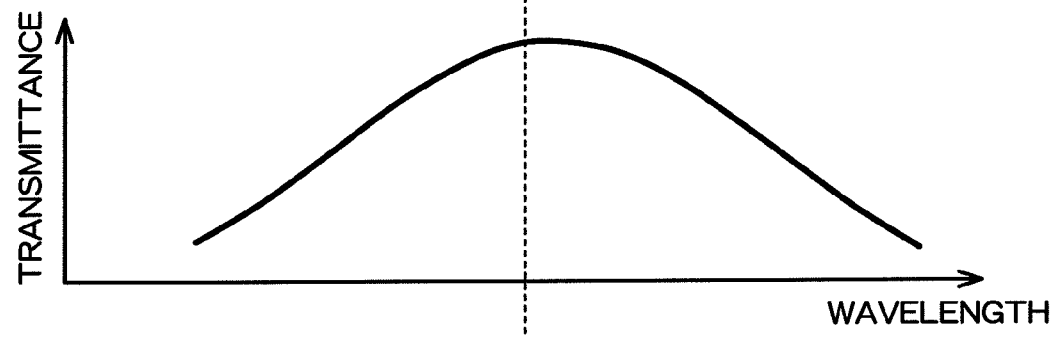
(c) ITU GRID FILTER
    CHARACTERISTICS
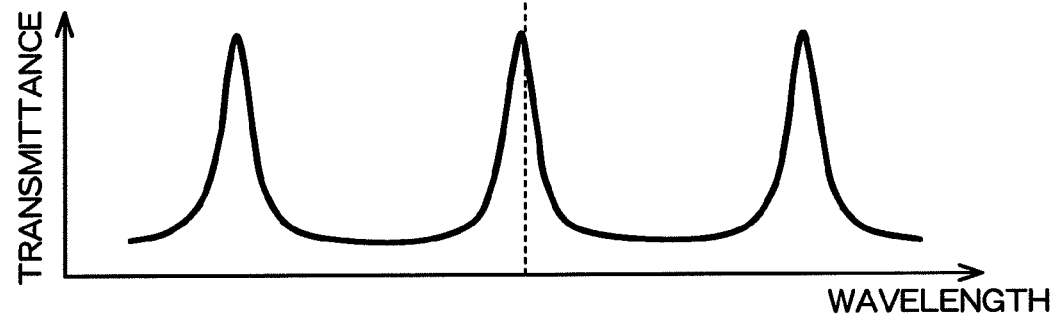

LASER DEVICE AND CONTROLLING METHOD THEREFOR

CROSS-REFERENCE TO RELATED APPLICATION

The present application claims priority from Japanese application JP 2007-320124 filed on Dec. 11, 2007, the content of which is hereby incorporated by reference into this application.

BACKGROUND OF THE INVENTION

1. Field of the Invention

The present invention relates to a laser device and a controlling method therefor.

2. Description of the Related Art

There is known an external resonator type laser device provided with a resonator including a wavelength selective filter and a semiconductor light amplifier so as to emit a single wavelength laser beam.

FIG. 7 is a block diagram illustrating a structure of a wavelength tunable laser module 90 that is a type of the external resonator type laser device. As illustrated in FIG. 7, the wavelength tunable laser module 90 includes: a resonator 20 including a mirror 22, a wavelength tunable filter 24 (first wavelength selective filter), an ITU grid filter 26 (second wavelength selective filter), a collimator lens 28, and a semiconductor light amplifier 30; a collimator lens 36; a beam splitter 38; a condenser lens 40; and an optical output detector 42, so as to deliver a single wavelength laser beam oscillated in the resonator 20 to an optical fiber 44.

In FIG. 7, the collimator lens 28 disposed at a left side of the semiconductor light amplifier 30 converts light emitted from an end surface 31 of the semiconductor light amplifier 30 into collimated light.

The mirror 22, the wavelength tunable filter 24 and the ITU grid filter 26 are disposed on an optical axis of the collimated light converted by the collimator lens 28. The mirror 22 is disposed to be perpendicular to the optical axis of the collimated light.

The semiconductor light amplifier 30 includes a light amplifying region 34 working as a gain medium and has a structure substantially similar to a semiconductor laser except that a reflectance of the end surface 31 is so small that laser oscillation is not induced by itself compared with the semiconductor laser. Instead, the semiconductor light amplifier 30 induces laser oscillation by using a resonator 20 including a reflector (mirror 22) and another end surface 35. In other words, the light emitted from the end surface 31 of the semiconductor light amplifier 30 passes through the collimator lens 28, the ITU grid filter 26 and the wavelength tunable filter 24, and is reflected by the mirror 22. Then, the light passes through the wavelength tunable filter 24, the ITU grid filter 26 and the collimator lens 28, and enters the semiconductor light amplifier 30. The light that has entered the semiconductor light amplifier 30 is amplified by the light amplifying region 34 and is reflected by the end surface 35 (a part of the light passes through the same) so that the light is emitted from the end surface 31 again. Note that the laser oscillation is induced when a gain (light amplification factor) of the semiconductor light amplifier 30 is larger than a loss in the resonator 20.

A wavelength of the laser beam can be selected in a variable manner by the wavelength selective filter (in particular, the wavelength tunable filter 24) which is capable of changing an operating wavelength and is disposed between the mirror 22 and the end surface 31 of the semiconductor light amplifier 30.

The semiconductor light amplifier 30 further includes a phase adjustment region 32 having a variable refractive index that varies in accordance with a signal supplied from the outside (that is usually current, and is hereinafter referred to as "phase adjustment signal"). When the refractive index of the phase adjustment region 32 varies, a phase of the light passing through a phase adjustment region 32 changes. As a result, a vacuum conversion length (hereinafter referred to as "effective length") of the resonator 20 varies. In other words, according to the semiconductor light amplifier 30, the effective length of the resonator 20 can be adjusted by changing the phase adjustment signal to be applied to the phase adjustment region 32. Note that JP 3-129890 A discloses a light source device having a single semiconductor element including a phase adjustment region and a light amplifying region so as to control the two regions individually.

In FIG. 7, a structure for monitoring intensity of the laser beam emitted from the end surface 35 of the semiconductor light amplifier 30 and a structure for delivering the laser beam to the outside are illustrated on a right side of the resonator 20.

The collimator lens 36 disposed at a right side of the semiconductor light amplifier 30 converts the laser beam emitted from the semiconductor light amplifier 30 to the collimated light.

The beam splitter 38 branches a part of the collimated light converted in the collimator lens 36 in a direction of the optical output detector 42. The optical output detector 42 monitors the part of the collimated light branched by the beam splitter 38, and detects the light intensity thereof.

The condenser lens 40 condenses the collimated light that has passed through the beam splitter 38 and delivers the condensed light to the optical fiber 44 as a laser beam. Thus, the laser beam oscillated in the wavelength tunable laser module 90 is taken out as an optical output to the outside.

Next, a laser oscillation wavelength (hereinafter simply referred to as "oscillation wavelength") of the wavelength tunable laser module 90 is described. As to the wavelength tunable laser module 90, there are three factors that determine the oscillation wavelength. The factors include a wavelength of light oscillated in the resonator 20 illustrated in FIG. 1(a) (hereinafter referred to as "resonance wavelength"), light transmission characteristics of the wavelength tunable filter 24 illustrated in FIG. 1(b), and light transmission characteristics of the ITU grid filter 26 illustrated in FIG. 1(c).

The resonance wavelength of the resonator 20 is a wavelength that forms a standing wave having nodes at the mirror 22 and the end surface 35 of the semiconductor light amplifier 30 in the resonator 20. Specifically, the resonance wavelength is a wavelength satisfying a condition "the length of the resonator 20 is an integral multiple of a half of the resonance wavelength (in the case where the refractive index in the resonator is 1)" (hereinafter referred to as "resonance condition"). According to this resonance condition, the resonance wavelength depends on the length of the resonator 20, and is distributed in a discrete manner within a wavelength band as illustrated in FIG. 1(a) (for instance, if the vacuum conversion length of the resonator is 15 mm and the oscillation wavelength is 1,550 nm, a resonance wavelength interval is approximately 80 pm). Note that a wavelength mode that satisfies the resonance condition of the resonator 20 is referred to as a resonator mode (cavity mode).

The oscillation wavelength of the wavelength tunable laser module 90 is a wavelength that can exist stably in the resonator 20 among a plurality of resonance wavelengths that satisfy the resonance condition described above. Specifically, the oscillation wavelength is the resonance wavelength of light that passes through the two wavelength selective filters (wavelength tunable filter 24 and ITU grid filter 26) disposed between the mirror 22 and the collimator lens 28.

The wavelength tunable filter 24 is a wavelength selective filter having characteristics in which only the light belonging in a specific wavelength band is permitted to pass through while other light is reflected, scattered or absorbed. As illustrated in FIG. 1(*b*), the wavelength tunable filter 24 usually has one peak transmission wavelength (wavelength at which a transmittance is peak) in an operating wavelength band of the wavelength tunable laser module 90, and a transmission wavelength band thereof is wider than the resonance wavelength interval illustrated in FIG. 1(*a*) (it is desirable that a half-value width of the wavelength be narrower than two periods of the ITU grid filter 26 illustrated in FIG. 1(*c*)). In addition, accuracy and stability of the operating wavelength of the wavelength tunable filter 24 are not sufficient.

The ITU grid filter 26 is a wavelength selective filter for permitting a plurality of wavelengths (ITU grid wavelengths) separated from each other recommended by the International Telecommunication Union (ITU) to pass through. As illustrated in FIG. 1(*c*), each transmission wavelength band of the ITU grid filter 26 corresponds to each of the plurality of ITU grid wavelengths distributed in a wide band, and is equal to the resonance wavelength interval illustrated in FIG. 1(*a*) or smaller. Note that an interval between the ITU grid wavelengths is approximately 100 pm, approximately 200 pm, approximately 400 pm or 800 pm.

The transmission wavelength band of the wavelength tunable filter 24 is wider than the resonance wavelength interval as described above, and hence it is difficult to select a single resonance wavelength as the oscillation wavelength stably by only the wavelength tunable filter 24. Therefore, the resonator 20 selects a single resonance wavelength among the plurality of resonance wavelengths by combining the light transmission characteristics of the wavelength tunable filter 24 with the light transmission characteristics of the ITU grid filter 26. In other words, a wavelength setting signal to be applied to the wavelength tunable filter 24 is adjusted so that the peak transmission wavelength of the wavelength tunable filter 24 corresponds to the ITU grid wavelength to be made to pass through, so as to constitute a narrow-band wavelength selective filter having a desired ITU grid wavelength as the peak transmission wavelength. The wavelength tunable laser module 90 having such the structure described above can select the oscillation wavelength in a variable manner by changing the wavelength setting signal to be applied to the wavelength tunable filter 24. Note that "Recent Progress on The Wide-Band Wavelength Tunable Lasers and Modules", Koji Kudo and other nine persons, IEICE Technical Report OPE, 2005, 25-30 (August, 2005) discloses a structure in which the first wavelength selective filter is combined with the second wavelength selective filter having the peak transmission wavelength as the ITU grid wavelength.

However, even if the narrow-band wavelength selective filter (wavelength tunable filter 24 and ITU grid filter 26) having the peak transmission wavelength as a desired ITU grid wavelength is configured, if the oscillation wavelength deviates from the peak transmission wavelength even by a little, the oscillation wavelength of the wavelength tunable laser module 90 will include an error so that light intensity is decreased.

Therefore, the wavelength tunable laser module 90 performs feedback control in which a deviation of the wavelength is detected and is corrected so that an operating oscillation wavelength agrees with the desired ITU grid wavelength. Specifically, the oscillation wavelength is controlled to agree with the desired ITU grid wavelength by a "peak search" in which light intensity of the laser beam emitted from the resonator 20 is monitored, and the oscillation wavelength is controlled so that the light intensity thereof becomes the maximum.

More specifically, the wavelength tunable laser module 90 performs "dither control" in which light intensity of a partial laser beam branched by the beam splitter 38 from the laser beam emitted from the resonator 20 is monitored by the optical output detector 42, and the phase adjustment signal to be applied to the phase adjustment region 32 of the semiconductor light amplifier 30 is increased and decreased (is changed to be a positive value and a negative value alternately) so that the light intensity thereof becomes the maximum. As described above, the effective length of the resonator 20 is expanded or contracted in accordance with the phase adjustment signal when it changes. When the effective length of the resonator 20 is expanded or contracted, a difference between the oscillation wavelength and the desired wavelength changes correspondingly. As a result, light intensity of the laser beam emitted from the resonator 20 changes.

For instance, if the light intensity increases when the phase adjustment signal (current) is increased, the phase adjustment signal is controlled to increase further. On the contrary, if the light intensity decreases when the phase adjustment signal is increased, the phase adjustment signal is controlled to decrease. In addition, if the light intensity increases when the phase adjustment signal is decreased, the phase adjustment signal is controlled to decrease further. On the contrary, if the light intensity decreases when the phase adjustment signal is decreased, the phase adjustment signal is controlled to increase. In this way, the wavelength tunable laser module 90 performs the peak search in which the phase adjustment signal is increased and decreased as the dither control so that the light intensity is maximized.

FIG. 2A is a graph illustrating an example of a relationship between the phase variation (horizontal axis) and the oscillation wavelength (vertical axis) or the light intensity (vertical axis) of the laser beam emitted from the resonator 20 (in the case where α parameter described later is zero). As illustrated in FIG. 2A, the oscillation wavelength changes substantially linearly with respect to the variation of the phase as a local aspect, but its resonator mode will be transferred to the adjacent resonator mode (mode hop) when the phase variation further changes so as to exceed a mode hop boundary. Therefore, the oscillation wavelength varies as a whole like a sawtooth with respect to a variation of the phase. In addition, the light intensity repeats its variation like a symmetric mountain shape with respect to the variation of the phase.

FIG. 2B is a graph illustrating wavelength and light intensity characteristics in which the horizontal axis and the vertical axis are respectively the oscillation wavelength and the light intensity illustrated in FIG. 2A. As illustrated in FIG. 2B, when the oscillation wavelength matches the peak transmission wavelength of the wavelength selective filter, the light intensity becomes the maximum. As a distance between the oscillation wavelength and the peak transmission wavelength increases, the light intensity is decreased. Then, if the oscillation wavelength exceeds the mode hop boundary, the number of waves in the standing wave within the resonator changes discontinuously, resulting in deterioration of the light signal. In addition, only if the oscillation wavelength becomes close to the mode hop boundary, a side mode increases in an optical spectrum or becomes multimode, resulting in deterioration of the light signal. Therefore, in order to prevent the light signal from being deteriorated, the laser device must be operated so that the oscillation wavelength is separated from the mode hop boundary. Therefore, it is necessary for the dither control in the above-mentioned peak search to change the phase adjustment signal so that the oscillation wavelength varies within the range separated from the mode hop boundary as illustrated in FIG. 2B.

As to this point, JP 8-18167 A discloses a variable wavelength light source device that changes the oscillation wavelength while keeping the same resonator mode (while preventing occurrence of the mode hop), by changing the current injected into the phase adjustment region of the semiconductor laser and the wavelength selected by a diffraction grating (wavelength selective filter) simultaneously.

In the semiconductor light amplifier 30 including the phase adjustment region 32 and the light amplifying region 34, there is the relationship as illustrated in FIGS. 3A and 3B between the variation of the refractive index (phase) and the variation of the gain (light intensity) (the ratio of those variations is referred to as "α parameter"). Note that broken lines of FIGS. 3A and 3B indicate relationships when the variation of the refractive index and the variation of the gain are not dependent on each other (in the case where α parameter is zero) similarly to FIGS. 2A and 2B.

FIG. 3A illustrates an example of a relationship between the phase variation (horizontal axis) and the oscillation wavelength (vertical axis) or the light intensity (vertical axis) of the laser beam emitted from the resonator 20. As illustrated in FIG. 3A, the oscillation wavelength does not change linearly with respect to the variation of the phase if the α parameter is not zero (solid lines). In addition, the light intensity repeats its variation like an asymmetric mountain shape with respect to the variation of the phase.

FIG. 3B is a graph illustrating wavelength and light intensity characteristics in which the horizontal axis and the vertical axis are respectively the oscillation wavelength and the light intensity illustrated in FIG. 3A. As illustrated in FIG. 3B, if the α parameter is not zero (solid line), the light intensity becomes the maximum when the oscillation wavelength matches the peak transmission wavelength of the wavelength selective filter. The variation of the light intensity becomes asymmetric with respect to the peak transmission wavelength between the short wave side (left side) and the long wave side (right side). In particular, in the range of the short wave side in which the oscillation wavelength is shorter than the peak transmission wavelength, a wavelength margin between the peak transmission wavelength and the mode hop boundary is smaller than that in the range of the long wave side. According to the experiment performed by the inventors, for instance, the wavelength margin is only 6 to 10 pm.

Further, if a light beam of narrow spectrum having light intensity of a few dBm or higher enters the optical fiber, the major portion thereof is returned to an inlet end of the optical fiber by a phenomenon called stimulated Brillouin scattering (SBS) so that electric power of the light transmitted through the optical fiber is decreased. In particular, the external resonator type laser device has a long resonator length, and hence the spectral line width of output light becomes narrow and is susceptible to the SBS.

Conventionally, in order to suppress the SBS, there is a known method in which the oscillation wavelength of the laser beam is changed in a short period, i.e., "frequency modulation" is performed on the laser beam. For instance, in order to reduce the influence of the SBS in the above-mentioned wavelength tunable laser module 90, the phase signal to be applied to the phase adjustment region 32 of the semiconductor light amplifier 30 should be modulated by an AC signal. Thus, the effective length of the resonator 20 is vibrated, which causes vibration of the oscillation wavelength of the laser beam delivered from the wavelength tunable laser module 90 (i.e., the frequency modulation is performed on the laser beam). Note that displacement of the wavelength due to the frequency modulation is approximately ±5 pm at most and that the frequency of the modulated signal is approximately 10 to 100 kHz.

However, the wavelength margin between the peak transmission wavelength and the mode hop boundary is smaller on the short wave side than that on the long wave side as for the semiconductor light amplifier 30 including the phase adjustment region 32 and the light amplifying region 34 as described above. Therefore, if the frequency modulation is further performed for suppressing the SBS on the phase adjustment signal on which the dither control is performed for the peak search, the displacement of the phase adjustment signal may reach a value that is the same as the width from the peak transmission wavelength to the mode hop boundary or larger. In other words, if the peak search and the SBS countermeasure are performed simultaneously, the side mode may increase in the optical spectrum, or the oscillation wavelength may vary discontinuously due to the mode hop, resulting in deterioration of the light signal.

Note that this problem is common to external resonator type laser devices in general, which are provided with a resonator including a wavelength selective filter and a semiconductor light amplifier having a phase adjustment region and a light amplifying region, and have an asymmetric wavelength and light intensity characteristics in which a wavelength margin between a peak transmission wavelength of the wavelength selective filter and a mode hop occurring wavelength on a short wave side is smaller than that on a long wave side.

SUMMARY OF THE INVENTION

The present invention has been made to solve the above-mentioned problems inherent in the conventional method, and it is an object of the present invention to provide a laser device capable of preventing deterioration of a light signal and a controlling method therefor.

In order to solve the above-mentioned problems, according to the present invention, there is provided an external resonator type laser device provided with a resonator including a wavelength selective filter and a semiconductor light amplifier having a phase adjustment region for changing a phase of light passing through the wavelength selective filter in accordance with a phase adjustment signal from outside and a light amplifying region, wherein a wavelength margin between a peak transmission wavelength at which a transmittance of the wavelength selective filter becomes the maximum and a mode hop occurring wavelength on a short wave side is smaller than that on a long wave side, the laser device including: light intensity detecting means for detecting light intensity of light emitted from the resonator; phase adjustment signal varying means for varying the phase adjustment signal to be applied to the phase adjustment region so that the light intensity detected by the light intensity detecting means becomes the maximum; and phase adjustment signal oscillating means for oscillating the phase adjustment signal to be applied to the phase adjustment region with a period shorter than a period of variation by the phase adjustment signal varying means, wherein the light intensity detecting means detects the light intensity in synchronization with oscillation of the phase adjustment signal by the phase adjustment signal oscillating means.

According to the present invention, the light intensity of the light emitted from the resonator is detected in synchronization with the oscillation of the phase adjustment signal. Therefore, it is possible to control the wavelength in consideration of a timing at which the wavelength of the light emitted from the resonator is deviated the most due to the oscillation. Thus, deterioration of the light signal due to the mode hop or the like can be prevented.

Further, according to an aspect of the present invention, the light intensity detecting means detects the light intensity during a period in which a wavelength of the light emitted from the resonator is deviated to the short wave side in accordance with the oscillation of the phase adjustment signal by the phase adjustment signal oscillating means.

According to this aspect, when the wavelength of the light emitted from the resonator is varied in a short wave direction, the detected (or sampled) light intensity becomes the maximum before the light intensity of the light emitted from the resonator becomes the maximum. Therefore, the wavelength of the light emitted from the resonator can be prevented from being deviated to the vicinity of the wavelength at which the mode hop will occur.

Moreover, in this aspect, the light intensity detecting means may detect the light intensity at a timing at which the wavelength of the light emitted from the resonator is deviated the most to the short wave side in accordance with the oscillation of the phase adjustment signal by the phase adjustment signal oscillating means.

Further, according to the present invention, there is provided a method of controlling an external resonator type laser device provided with a resonator including a wavelength selective filter and a semiconductor light amplifier having a phase adjustment region for changing a phase of light passing through the wavelength selective filter in accordance with a phase adjustment signal from outside and a light amplifying region, wherein a wavelength margin between a peak transmission wavelength at which a transmittance of the wavelength selective filter becomes the maximum and a mode hop occurring wavelength on a short wave side is smaller than that on a long wave side, the method including: detecting light intensity of light emitted from the resonator; varying the phase adjustment signal to be applied to the phase adjustment region so that the light intensity detected in the detecting becomes the maximum; and oscillating the phase adjustment signal to be applied to the phase adjustment region with a period shorter than a period of variation in the varying, in which the light intensity is detected in the detecting in synchronization with oscillation of the phase adjustment signal in the oscillating.

According to the present invention, the light intensity of the light emitted from the resonator can be detected in synchronization with the oscillation of the phase adjustment signal. Therefore, it is possible to control the wavelength in consideration of the timing at which the wavelength of the light emitted from the resonator is deviated the most due to the oscillation. Thus, deterioration of the light signal due to the mode hop or the like can be prevented.

BRIEF DESCRIPTION OF THE DRAWINGS

In the accompanying drawings:

FIG. 1 is a graph illustrating three factors that determine a laser oscillation wavelength of a wavelength tunable laser module;

DETAILED DESCRIPTION OF THE INVENTION

Hereinafter, with reference to the attached drawings, an embodiment of the present invention is described in detail.

Figure 2A:
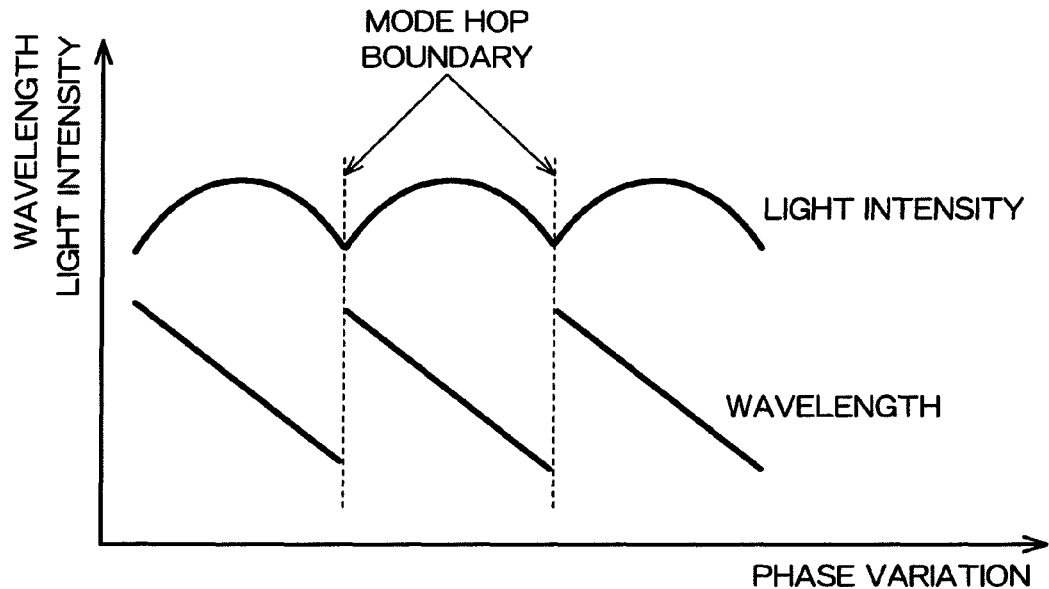
FIGS. 2A and 2B are graphs illustrating an example of a relationship between a phase variation and an oscillation wavelength or light intensity of a laser beam emitted from a resonator (in the case where α parameter is zero)
Figure 2B:
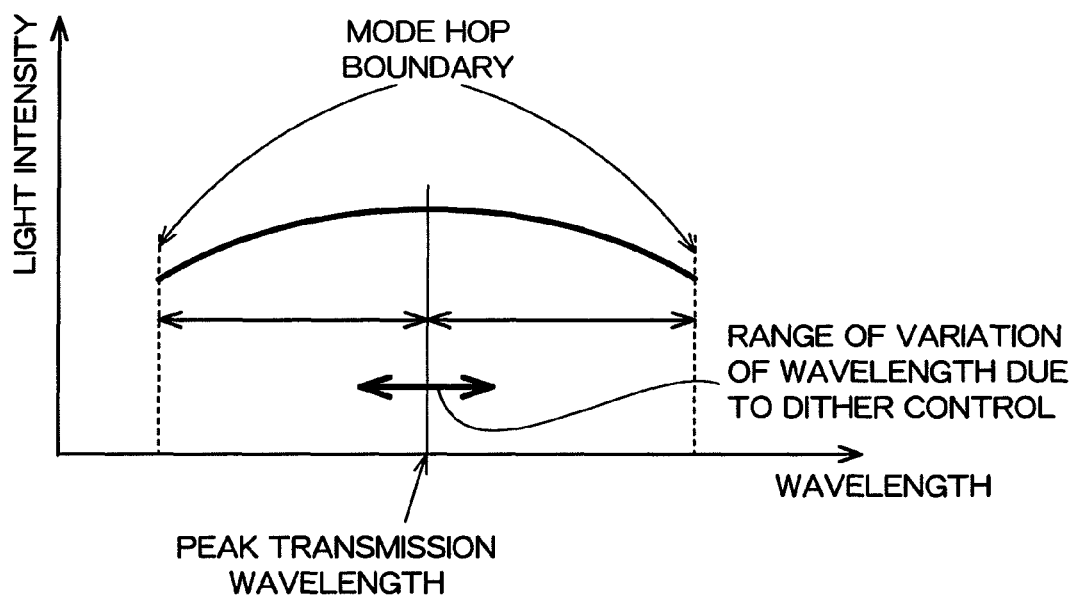
Figure 3A:
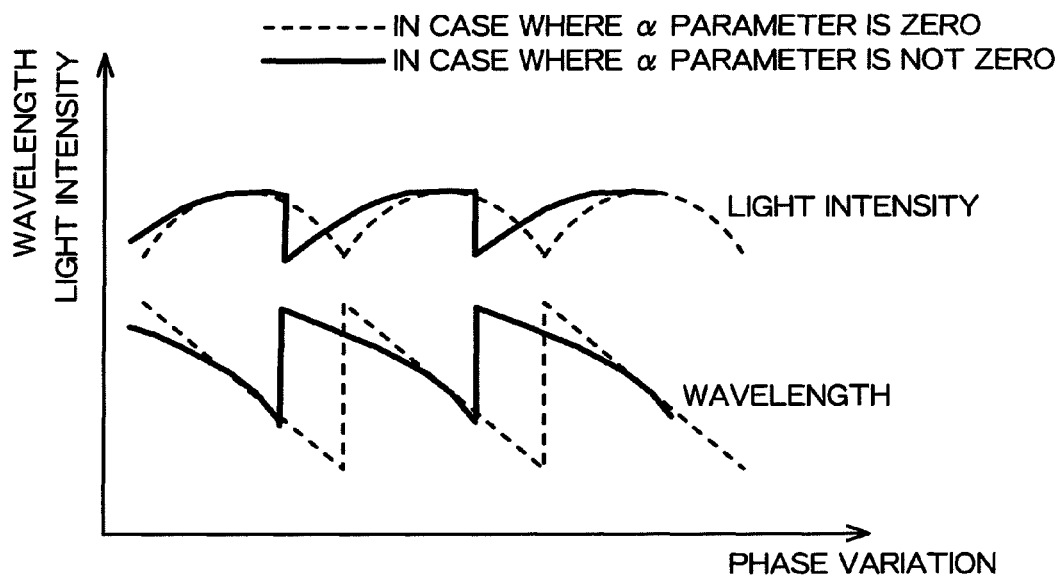
FIGS. 3A and 3B are graphs illustrating an example of a relationship between the phase variation and the oscillation wavelength or the light intensity of the laser beam emitted from the resonator (in the case where the α parameter is zero and in the case where the α parameter is not zero)
Figure 3B:
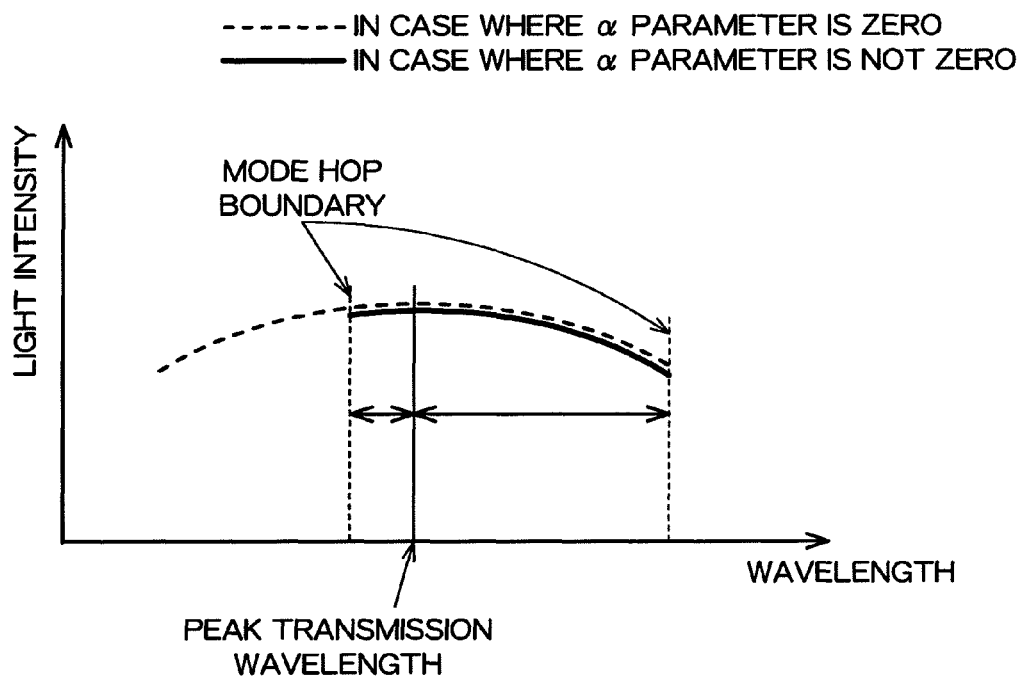
Figure 4:
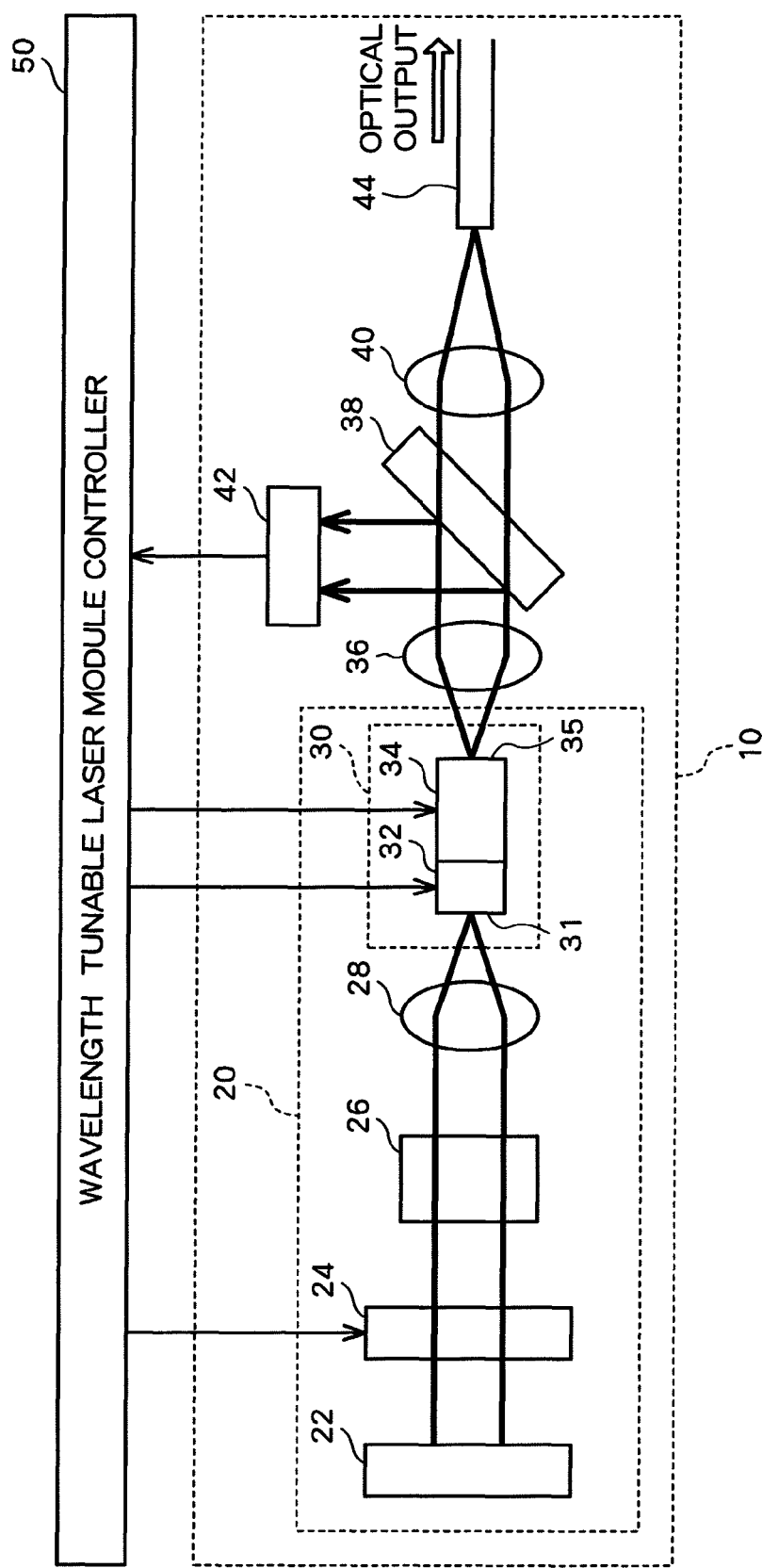
FIG. 4 is a block diagram illustrating a structure of a wavelength tunable laser module according to an embodiment of the present invention.

FIG. 4 is a block diagram illustrating a structure of a wavelength tunable laser module 10 according to the embodiment of the present invention. As illustrated in FIG. 4, the wavelength tunable laser module 10 includes a resonator 20 having a mirror 22, a wavelength tunable filter 24, an ITU grid filter 26, a collimator lens 28 and a semiconductor light amplifier 30, a collimator lens 36, a beam splitter 38, a condenser lens 40 and an optical output detector 42, and is controlled by a wavelength tunable laser module controller 50. The wavelength tunable laser module 10 has the structure similar to the wavelength tunable laser module 90 described above, and hence a structure of the wavelength tunable laser module controller 50 is mainly described below.

Further, although not shown in FIG. 4, the wavelength tunable laser module 10 also includes a thermoelectric cooler (TEC) for keeping temperature constant, a thermistor for sensing temperature, an optical isolator for eliminating reflected return light and the like adding to the above-mentioned structure.

Figure 5:
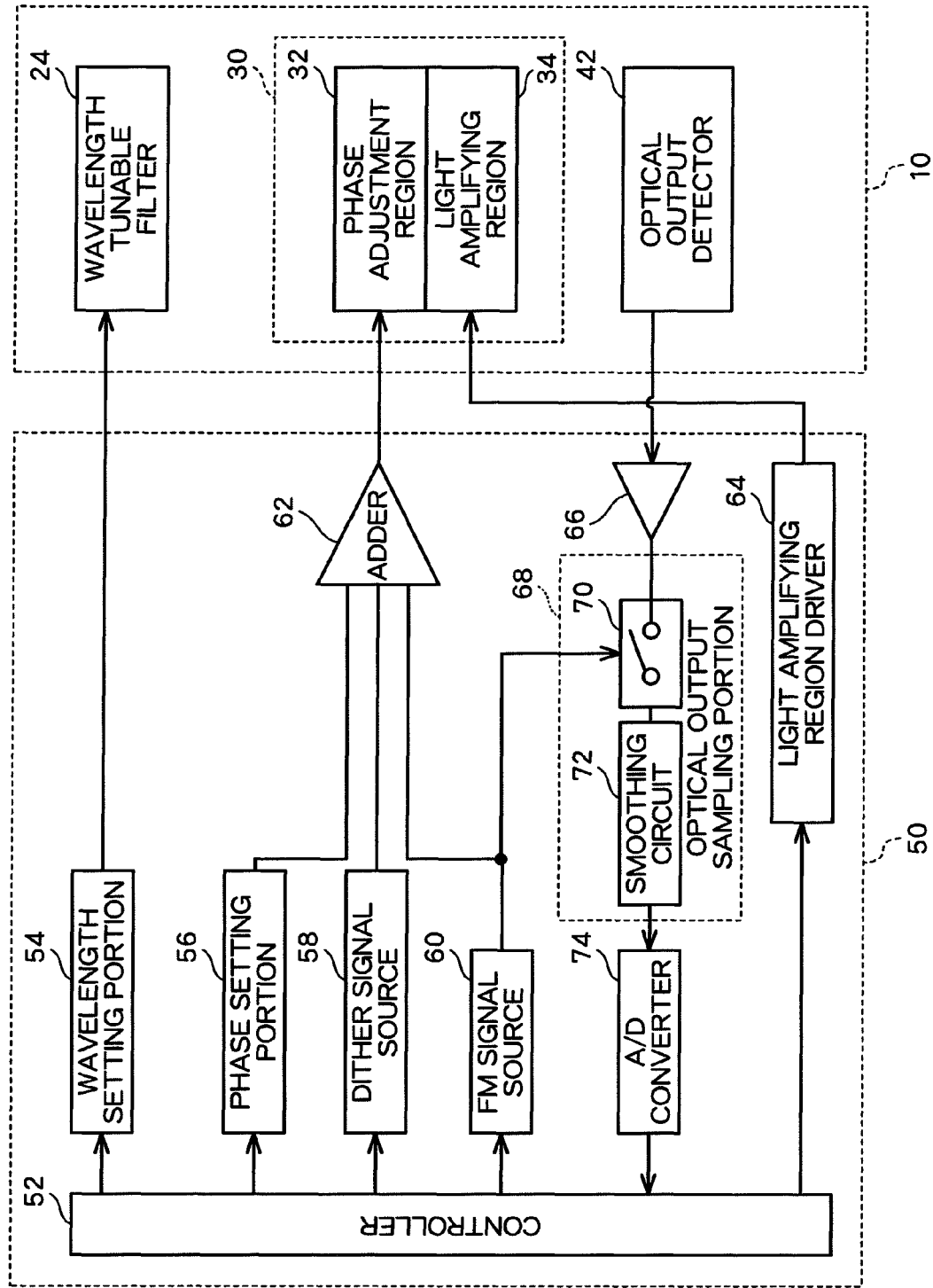
FIG. 5 is a block diagram of a wavelength tunable laser module controller according to the embodiment of the present invention.

FIG. 5 is a block diagram of the wavelength tunable laser module controller 50. As illustrated in FIG. 5, the wavelength tunable laser module controller 50 includes a controller 52, a wavelength setting portion 54, a phase setting portion 56, a dither signal source 58, an FM signal source 60, an adder 62, a light amplifying region driver 64, an amplifier circuit 66, an optical output sampling portion 68 (switch circuit 70 and smoothing circuit 72), an A/D converter 74 and a temperature controller (not shown). In addition, the wavelength tunable laser module controller 50 is connected to the wavelength tunable laser module 10 via a plurality of signal lines.

The controller 52 is made up of a microcontroller and a program for controlling operations of the microcontroller, for instance, and controls individual portions of the wavelength tunable laser module controller 50.

The wavelength setting portion 54 is connected to the wavelength tunable filter 24, and applies a wavelength setting signal to the wavelength tunable filter 24 to drive the wavelength tunable filter 24 so that a peak transmission wavelength of the wavelength tunable filter 24 becomes a predetermined ITU grid wavelength. Further, in order that the peak transmission wavelength of the wavelength tunable filter 24 agrees accurately with the predetermined ITU grid wavelength, dither control may be performed on the wavelength setting signal to be applied to the wavelength tunable filter 24.

The phase setting portion 56 is connected to a phase adjustment region 32 of the semiconductor light amplifier 30 via the adder 62, and adjusts a refractive index of the phase adjustment region 32 so that an effective length of the resonator 20 becomes a predetermined length. Specifically, the phase setting portion 56 reads out a phase set value corresponding to the wavelength set by the wavelength setting portion 54 from a storage portion (not shown) storing the phase set value for each wavelength, and generates a phase adjustment signal (DC offset component) to be applied to the phase adjustment region 32 based on the read phase set value, thereby delivering the generated phase adjustment signal to the adder 62.

The dither signal source 58 is connected to the phase adjustment region 32 of the semiconductor light amplifier 30 via the adder 62, and performs the dither control in which the phase adjustment signal to be applied to the phase adjustment region 32 is increased and decreased for a peak search. Specifically, in order that an optical output monitor signal value supplied via the controller 52 or the like from the optical output sampling portion 68 described later becomes the maximum, the dither signal source 58 generates an AC signal (hereinafter referred to as "dither signal") for increasing and decreasing the phase adjustment signal generated by the phase setting portion 56 with respect to a center of a state in which the optical output monitor signal value becomes the maximum, and delivers the generated dither signal to the adder 62. Note that period of the dither signal generated by the dither signal source 58 is approximately a few milliseconds, for instance.

The FM signal source 60 is connected to the phase adjustment region 32 of the semiconductor light amplifier 30 via the adder 62 so as to oscillate the phase adjustment signal to be applied to the phase adjustment region 32 with a short period for suppressing stimulated Brillouin scattering (SBS). Specifically, the FM signal source 60 generates a frequency modulated signal (hereinafter referred to as "FM signal") that is an AC signal oscillating with a period shorter than the period of the dither signal generated by the dither signal source 58 (i.e., approximately 10 to 20 microseconds corresponding to a frequency of approximately a few tens to 100 kHz), and delivers the generated FM signal to the adder 62.

The adder 62 adds the dither signal supplied from the dither signal source 58 and the FM signal supplied from the FM signal source 60 to the phase adjustment signal supplied from the phase setting portion 56, and applies the new phase adjustment signal to which the three signals are added (that is described later) to the phase adjustment region 32 of the semiconductor light amplifier 30.

The light amplifying region driver 64 is connected to a light amplifying region 34 of the semiconductor light amplifier 30, and applies an optical gain control signal to the light amplifying region 34 so that a gain of the light amplifying region 34 becomes a predetermined gain to drive the light amplifying region 34.

The amplifier circuit 66 is connected to the optical output detector 42, and amplifies the optical output monitor signal that is a minute current supplied from the optical output detector 42, thereby delivering the amplified signal to the optical output sampling portion 68.

The optical output sampling portion 68 includes the switch circuit 70 and the smoothing circuit 72. The switch circuit 70 is connected to the FM signal source 60, and samples the optical output monitor signal supplied from the amplifier circuit 66 in synchronization with oscillation of the FM signal generated by the FM signal source 60. The smoothing circuit 72 averages a plurality of sampling signals sampled by the switch circuit 70 so as to reduce an error generated by noise or the like. This averaged sampling signal is converted into an optical output monitor signal value (digital signal) by the A/D converter 72, and is fed back to the dither signal source 58 via the controller 52.

Figure 6:
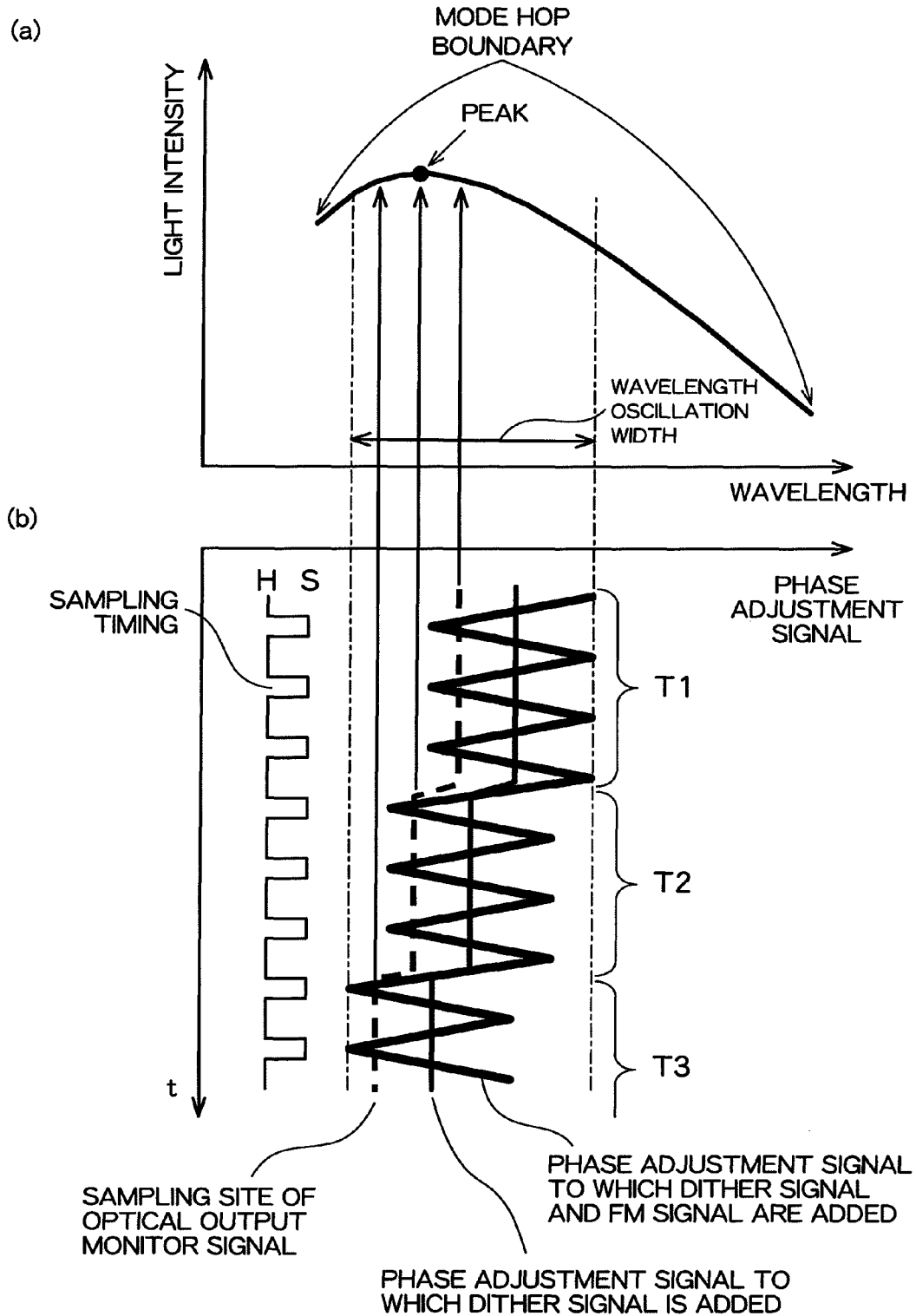
FIG. 6 is a graph illustrating wavelength and light intensity characteristics of the laser beam emitted from the resonator (in the case where the α parameter is not zero) and time variation of a phase adjustment signal in the wavelength tunable laser module according to the embodiment of the present invention, respectively.
Figure 7:
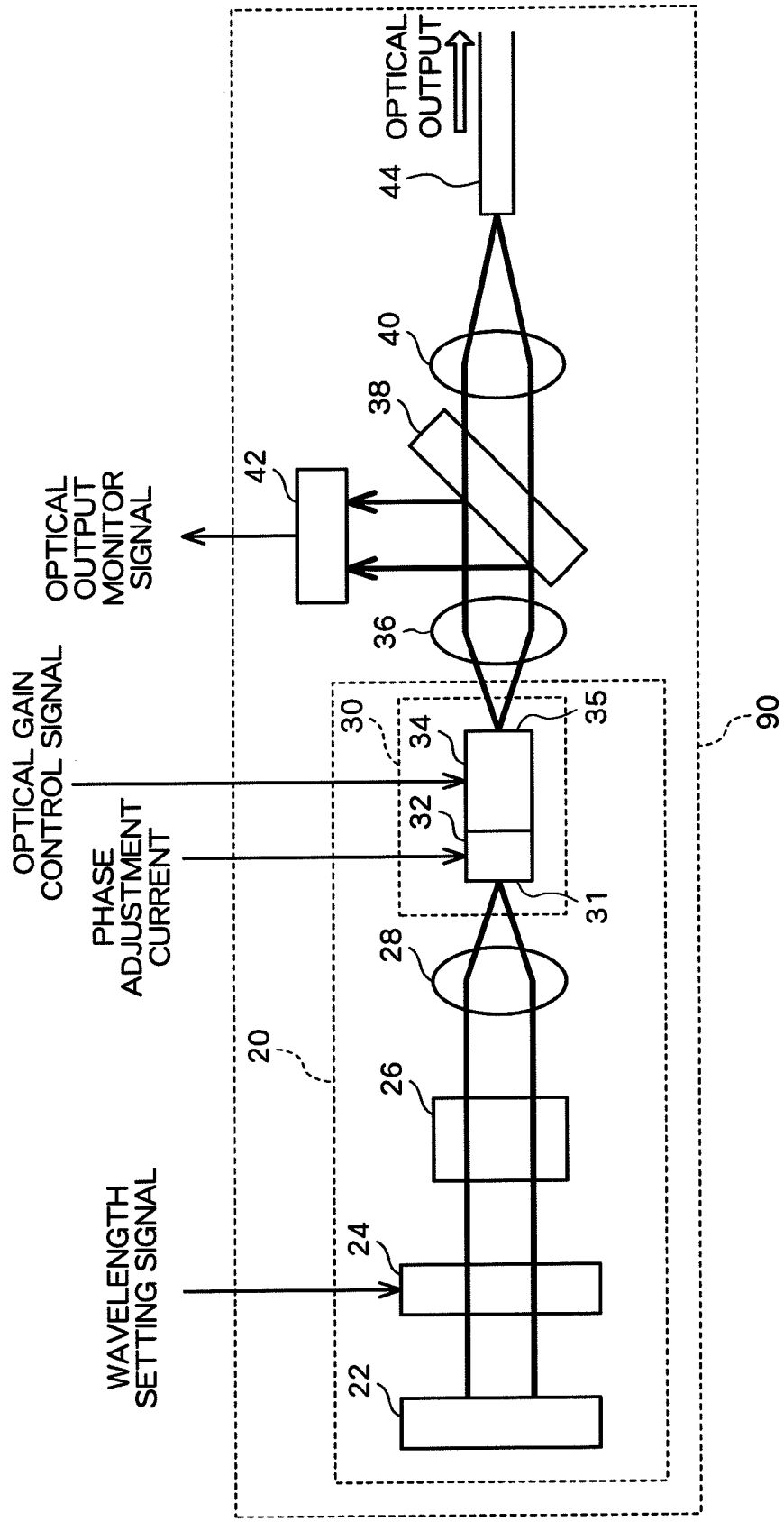
FIG. 7 is a block diagram illustrating a structure of a wavelength tunable laser module that is one of external resonator type laser devices.

Here, with reference to FIGS. 6(a) and 6(b), a timing when the optical output sampling portion 68 samples the optical output monitor signal supplied from the amplifier circuit 66 is described in detail.

FIG. 6(a) is a graph illustrating wavelength and light intensity characteristics of a laser beam emitted from the resonator 20 (in the case where α parameter is not zero). As illustrated in FIG. 6(a), a wavelength margin between the peak transmission wavelength of the wavelength selective filter (wavelength tunable filter 24 and ITU grid filter 26) and a mode hop occurring wavelength (mode hop boundary) is smaller in a short wave side of the peak transmission wavelength.

FIG. 6(b) is a graph illustrating a time variation of the phase adjustment signal applied from the adder 62 to the phase adjustment region 32. As described above, the phase adjustment signal illustrated in FIG. 6(b) is a signal made up of the phase adjustment signal (DC signal) generated by the phase setting portion 56 to which the dither signal (AC signal) generated by the dither signal source 58 and the FM signal generated by the FM signal source 60 (AC signal oscillating with a period shorter than a variation period of the dither signal) are added. For a simple description here, it is supposed that the dither signal to be added to the phase adjustment signal is an AC signal that varies in a step-like manner and that T1 and T2 correspond to a half period of the dither signal.

When the above-mentioned phase adjustment signal is applied to the phase adjustment region 32 as illustrated in FIGS. 6(a) and 6(b), an oscillation wavelength of the laser beam emitted from the resonator 20 varies in accordance with a variation of a dither signal component of the phase adjustment signal. Therefore, light intensity of the laser beam emitted from the resonator 20 varies in accordance with the variation of the dither signal component of the phase adjustment signal. In addition, the oscillation wavelength of the laser beam emitted from the resonator 20 further oscillates in accordance with oscillation of an FM signal component of the phase adjustment signal. Therefore, the laser beam that is emitted from the resonator 20 and enters an optical fiber 44 is hardly affected by the stimulated Brillouin scattering (SBS).

The light intensity of the laser beam that varies and oscillates in the above-mentioned manner is monitored by the optical output detector 42 and is amplified by the amplifier circuit 66, and then is delivered to the optical output sampling portion 68. The optical output sampling portion 68 samples the optical output monitor signal in synchronization with the FM signal component of the phase adjustment signal.

In other words, the optical output sampling portion 68 samples the optical output monitor signal in a period in which the wavelength of the laser beam emitted from the resonator 20 is deviated to the short wave side in accordance with the oscillation of the FM signal component of the phase adjustment signal (period S illustrated in FIG. 6(b)), and keeps the sampled optical output monitor signal value in the other period (period H illustrated in FIG. 6(b)), as illustrated in FIGS. 6(a) and 6(b). As described above, the variation period of the dither signal is approximately a few milliseconds while an oscillation period of the FM signal is approximately 10 to 20 microseconds. Therefore, a plurality of sampled values can be obtained during one period of the dither signal.

Thus, when the wavelength of the laser beam emitted from the resonator 20 varies in a short wave direction in accordance with the variation of the dither signal component of the phase adjustment signal, light intensity sampled by the optical output sampling portion 68 becomes the maximum before the light intensity of the laser beam emitted from the resonator 20 becomes the maximum. Specifically, in FIG. 6(a), the optical output monitor signal value sampled by the optical output sampling portion 68 becomes the maximum in the period T2 before T3 in which the light intensity of the laser beam emitted from the resonator 20 becomes the maximum. The dither signal source 58 generates a dither signal such that the phase adjustment signal is increased and decreased with respect to the center of the state in which the optical output monitor signal value becomes the maximum. Therefore, the dither signal is increased and decreased (varies to be positive and negative values) with respect to the center of the state corresponding to the period T2. As a result, the phase adjustment signal to which the dither signal and the FM signal are added varies and oscillates within a range defined by dashed dotted lines illustrated in FIG. 6(b). The wavelength of the laser beam emitted from the resonator 20 also varies and oscillates in a range defined by dashed dotted lines illustrated in FIG. 6(a). Thus, the wavelength tunable laser module 10 decides the sampling timing of the optical output monitor signal so that the wavelength of the laser beam is not deviated to the vicinity of the mode hop boundary, thereby preventing deterioration of a light signal.

Further, the optical output sampling portion 68 may sample the optical output monitor signal in accordance with a timing when the wavelength of the laser beam emitted from the resonator 20 is deviated by the maximum in the short wave direction in accordance with the oscillation of the FM signal component of the phase adjustment signal. For instance, in order that a variation width of the oscillation wavelength as a result of the dither control and the frequency modulation becomes a half or smaller of the wavelength margin between the peak transmission wavelength and the mode hop boundary for securely preventing deterioration of the light signal, it is desirable that the sampling period of the optical output monitor signal (period S illustrated in FIG. 6(b)) be 20% or smaller of the oscillation period of the FM signal with respect to the center of the timing when the oscillation wavelength is deviated the most in the short wave direction in accordance with the oscillation of the FM signal.

According to the embodiment described above, the light intensity of the light emitted from the resonator 20 is detected in synchronization with the oscillation of the phase adjustment signal. Therefore, it is possible to control the wavelength in consideration of the timing when the wavelength of the light emitted from the resonator 20 is deviated the most due to the oscillation. Thus, the deterioration of the light signal due to the mode hop or the like can be prevented.

Note that the present invention is not limited to the embodiment described above. The present invention has been applied to the wavelength tunable laser module that is one of external resonator type laser devices in the embodiment described above, but the present invention can be applied to external resonator type laser devices in general, which are provided with a resonator including a semiconductor light amplifier having a phase adjustment region and a light amplifying region, and have an asymmetric wavelength and light intensity characteristics in which the wavelength margin between the peak transmission wavelength of the wavelength selective filter and the mode hop occurring wavelength on a short wave side is smaller than that on a long wave side.

In addition, in the embodiment described above, the mirror 22 and the wavelength tunable filter 24 illustrated in FIG. 4 may be replaced with a wavelength selective mirror capable of changing a reflection wavelength. In this case, the transmittance in the light transmission characteristics of the wavelength tunable filter 24 illustrated in FIG. 1(b) should be read into a reflectance.

While there have been described what are at present considered to be a certain embodiment of the invention, it is understood that various modifications may be made thereto, and it is intended that the appended claims cover all such modifications as fall within the true spirit and scope of the invention.

What is claimed is:

1. An external resonator type laser device provided with a resonator including a wavelength selective filter and a semiconductor light amplifier having a phase adjustment region for changing a phase of light passing through the wavelength selective filter in accordance with a phase adjustment signal from outside and a light amplifying region, wherein a wavelength margin between a peak transmission wavelength at which a transmittance of the wavelength selective filter becomes the maximum and a mode hop occurring wavelength on a short wave side is smaller than that on a long wave side, the laser device comprising:

light intensity detecting means for detecting light intensity of light emitted from the resonator;

phase adjustment signal varying means for varying the phase adjustment signal to be applied to the phase adjustment region so that the light intensity detected by the light intensity detecting means becomes the maximum; and phase adjustment signal oscillating means for oscillating the phase adjustment signal to be applied to the phase adjustment region with a period shorter than a period of variation by the phase adjustment signal varying means, wherein the light intensity detecting means detects the light intensity only during a period in which a wavelength of the light emitted from the resonator is deviated to the short wave side in accordance with the oscillation of the phase adjustment signal by the phase adjustment signal oscillating means.

2. The laser device according to claim 1, wherein the light intensity detecting means detects the light intensity only at a sampling timing corresponding to a timing at which the wavelength of the light emitted from the resonator is deviated the most to the short wave side in accordance with the oscillation of the phase adjustment signal by the phase adjustment signal oscillating means.

3. A method of controlling an external resonator type laser device provided with a resonator including a wavelength selective filter and a semiconductor light amplifier having a phase adjustment region for changing a phase of light passing through the wavelength selective filter in accordance with a phase adjustment signal from outside and a light amplifying region, wherein a wavelength margin between a peak transmission wavelength at which a transmittance of the wavelength selective filter becomes the maximum and a mode hop occurring wavelength on a short wave side is smaller than that on a long wave side, the method comprising:

detecting light intensity of light emitted from the resonator;

varying the phase adjustment signal to be applied to the phase adjustment region so that the light intensity detected in the detecting becomes the maximum; and oscillating the phase adjustment signal to be applied to the phase adjustment region with a period shorter than a period of variation in the varying, wherein the light intensity is detected only during a period in which a wavelength of the light emitted from the resonator is deviated to the short wave side in accordance with the oscillation of the phase adjustment signal.

4. An external resonator type laser device provided with a resonator including a wavelength selective filter and a semiconductor light amplifier having a phase adjustment region for changing a phase of light passing through the wavelength selective filter in accordance with a phase adjustment signal from outside and a light amplifying region, wherein a wavelength margin between a peak transmission wavelength at which a transmittance of the wavelength selective filter becomes the maximum and a mode hop occurring wavelength on a short wave side is smaller than that on a long wave side, the laser device comprising:

an optical output detector that detects light intensity of light emitted from the resonator; and a wavelength tunable laser module controller that includes:

a dither signal source that varies the phase adjustment signal to be applied to the phase adjustment region so that the light intensity detected by the optical output detector becomes the maximum;

a FM signal source for oscillating the phase adjustment signal to be applied to the phase adjustment region with a period shorter than a period of variation by the dither signal source, wherein the optical output detector detects the light intensity only during a period in which a wavelength of the light emitted from the resonator is deviated to the short wave side in accordance with the oscillation of the phase adjustment signal by the FM signal source.

5. The laser device according to claim 4, wherein the optical output detector detects the light intensity only at a sampling timing corresponding to a timing at which the wavelength of the light emitted from the resonator is deviated the most to the short wave side in accordance with the oscillation of the phase adjustment signal by the FM signal source.

6. The method of controlling the laser device according to claim 3, wherein the light intensity is detected only at a sampling timing corresponding to a timing at which the wavelength of the light emitted from the resonator is deviated the most to the short wave side in accordance with the oscillation of the phase adjustment signal.

* * * * *